United States Patent
Li et al.

(10) Patent No.: US 7,253,483 B2
(45) Date of Patent: Aug. 7, 2007

(54) SEMICONDUCTOR DEVICE LAYOUT AND CHANNELING IMPLANT PROCESS

(75) Inventors: Yisuo Li, Singapore (SG); Xiaohong Jiang, Singapore (SG); Francis Benistant, San Jose, CA (US)

(73) Assignee: Chartered Semiconductor Manufacturing, LTD, Singapore (SG)

( * ) Notice: Subject to any disclaimer, the term of this patent is extended or adjusted under 35 U.S.C. 154(b) by 0 days.

(21) Appl. No.: 11/167,640

(22) Filed: Jun. 27, 2005

(65) Prior Publication Data

US 2005/0280082 A1   Dec. 22, 2005

Related U.S. Application Data

(62) Division of application No. 10/768,612, filed on Jan. 30, 2004, now Pat. No. 6,972,236.

(51) Int. Cl.
    *H01L 29/76* (2006.01)
    *H01L 29/94* (2006.01)
    *H01L 31/00* (2006.01)

(52) U.S. Cl. ............... 257/401; 257/628; 257/629; 257/E29.003; 257/E29.004; 257/E31.04

(58) Field of Classification Search ............... 257/401, 257/628, 629, E23.003, E29.004, E31.04
    See application file for complete search history.

(56) References Cited

U.S. PATENT DOCUMENTS

| | | | |
|---|---|---|---|
| 4,728,617 A | | 3/1988 | Woo et al. |
| 5,729,045 A | * | 3/1998 | Buynoski ............... 257/627 |
| 5,970,330 A | | 10/1999 | Buynoski |
| 6,525,403 B2 | * | 2/2003 | Inaba et al. ............ 257/618 |
| 6,528,387 B1 | * | 3/2003 | Moriyasu et al. ......... 438/404 |
| 6,566,204 B1 | | 5/2003 | Wang et al. |
| 6,599,804 B2 | | 7/2003 | Bulucea et al. |
| 6,835,627 B1 | * | 12/2004 | Whiston et al. ........... 438/302 |

OTHER PUBLICATIONS

Masahi Shima, "<100> Strained-SiGe- channel p-MOSFET with enhanced hole mobility and lower parasitic Resistance", Fujitsu Sci. Tech. J.,39,1, p. 78-83 (Jun. 2003).

Oldiges, et al., "Molecular Dynamics Simulations of LATID implants into Silicon", found on Website http://beam.helsinki.fi/~knordlun/pub/sispad97.pdf ~Mar. 1, 2004 see http://www.acclab.helsinki.fi/~knordlun/pub/.

Brand et al., Intel's 0.25 micron, 2.0V logic process technology, Intel Technology Journal Q3,98, pp. 1-4.

* cited by examiner

*Primary Examiner*—Ngân V. Ngô
(74) *Attorney, Agent, or Firm*—William J. Stoffel (57) ABSTRACT

A device structure and method for forming graded junction using a implant process. Embodiments of the invention comprise implanting ions into said silicon substrate to form doped regions adjacent to said gate. The orientation of the channel region in the Si crystal structure (channel direction <100>) in combination with the large angle tilt and twist implant process produce doped regions that have a more graded junction. The orientation and implant process creates more channeling of ions. The channeling of ions creates a more graded junction. When implemented on a HV MOS TX, the graded junction of the LDD increases the breakdown voltage. Another embodiment is a FET with an annular shaped channel region.

23 Claims, 8 Drawing Sheets

OFFSET LDMOS

FIGURE 7

NON-OFFSET LDMOS

SEMICONDUCTOR DEVICE LAYOUT AND CHANNELING IMPLANT PROCESS

This is a divisional of patent application Ser. No. 10/768,612, filing date Jan. 30, 2004, now U.S. Pat. No. 6,972,236 entitled: A SEMICONDUCTOR DEVICE LAYOUT AND CHANNELING IMPLANT PROCESS, assigned to the same assignee as the present invention.

BACKGROUND OF INVENTION

1) Field of the Invention

This invention relates generally to fabrication of semiconductor devices particularly to the fabrication of implanted doped regions in a semiconductor device that has a graded junction 2) Description of the Related Art With higher levels of integrated circuits on semiconductor chips and the need for faster transistors in these circuits, the FET transistor must maximize all aspects of semiconductor physics to fabricate transistors in these circuits with faster switching speed.

As the transistor scaling to smaller dimension, the inventor have found that high Vt NMOS transistor is facing a problem with voltage limitation. Thermal cycle was limited because of the consideration of logic device in the wafer. An aspect of this invention address issue.

In crystalline solids, such as monocrystalline silicon, the atoms which make up the solid are spatially arranged in a periodic fashion. This periodic arrangement of atoms in a crystal is called a lattice. The crystal lattice always contains a volume which is representative of the entire lattice and it is regularly repeated throughout the crystal. The directions in a lattice are expressed as a set of three integers with the same relationship as the components of a vector in that direction. The three vector components are given in multiples of the basic vectors. For example, in cubic lattices, such as silicon which has a diamond crystal lattice, the body diagonal has the components of 1a, 1b, and 1c and this diagonal exist along the [111] direction with the [ ] brackets being used to denote a specific direction. However, many directions in a crystal are equivalent, depending on the arbitrary choice of orientation of the axes. Such equivalent directions are denoted with < > brackets and, for example, crystal directions in the cubic lattice [100], [010], and [001] are all crystallographically equivalent and are <100> directions. Since these directions will also be on the negative side of the origin, as arbitrarily defined, they also are identified with a (–) over the specific negative integer, such as [$\bar{1}$00], [0$\bar{1}$0], and [00$\bar{1}$] for <100> directions. Unless specifically stated or shown in the following description in this application, a crystal direction includes both positive and negative integers.

Planes in a crystal also can be determined with a set of three integers h, k, and l. They are used to define a set of parallel planes and each set of three integers in ( ) parentheses identify a specific plane. As in the case of directions, many planes in a lattice are equivalent and the indices of such equivalent planes are denoted by { } parentheses. For cubic lattices, direction [k,l,m] is perpendicular to a plane with the identical three integers (k,l,m). Thus, if either a direction or a plane of a cubic lattice is known, its perpendicular counterpart can be quickly determined without calculation. For example, for planes of equivalent symmetry such as {100} plane, the equivalent planes are (100), (010), (001), (100), (010), and (001). Like the crystal direction, the crystal plane in the following description in this application includes both positive and negative integers unless specifically stated otherwise.

General terminology is: ( ) for a certain plane; { } for a group of planes; [ ] for a certain direction; < > for a group of directions.

Ion implant processes are important to forming doped regions in substrates. The depth to which an ion becomes implanted is proportional to its kinetic energy. The implanted distribution in an amorphous target is roughly a Gaussian distribution characterized by a mean, known as the range, and a standard deviation, known as the straggle. In a single crystal target, the range and straggle for a given implant may be different than that in amorphous material, due to a phenomena known as channeling. Higher ion energy, higher silicon temperature, and the growth of silicon dioxide layers on the silicon all tend to dechannel implants. In any event, range and straggle data for various materials including silicon, silicon dioxide, and photoresist have been determined.

The more relevant technical art in the patent literature is as follows: U.S. Pat. No. 5,970,300 (Buynoski) shows an alignment of a FET on a wafer.

U.S. Pat. No. 6,566,204 (Wang, et al.) teaches the use of mask shadowing and angled implantation in fabricating asymmetrical field-effect transistors.

U.S. Pat. No. 6,599,804 (Bulucea, et al.)shows a fabrication of field-effect transistor for alleviating short-channel effects.

U.S. Pat. No. 4,728,617 (Woo, et al.) shows a method of fabricating a MOSFET with graded source and drain regions using a high tilt I/I.

However, there is a need for an improved process and device.

SUMMARY OF THE INVENTION

It is an object of an embodiment the present invention to provide a device and method for fabricating a transistor with a graded doped region.

It is an object of an embodiment the present invention to provide a high voltage MOS device that has a higher breakdown voltage.

Some embodiments of the invention comprise implanting ions into said silicon substrate to form doped regions adjacent to said gate. The orientation of the channel region in the Si crystal structure (channel direction <100>) in combination with the large angle tilt and twist implant process that increases channeling (described below) produces doped regions that have a more graded (gradual) junction.

With the embodiment's (a) transistor with a channel direction at <100> and (b) the 45 tilt and 45 twist implant, the implanted ions enter the substrate at the <1 1 0> direction. This direction increases the channeling of the ion to create a graded junction.

An embodiment is a method of fabrication of doped regions in a semiconductor device; comprising the steps of:
a) providing a {001} silicon substrate;
b) forming a gate over said silicon substrate; said gate having a width and a length;
   a channel under the gate; said channel having a channel direction parallel with the direction of said gate width; said channel direction is [100] or [010] direction;
c) implanting ions into said silicon substrate to form a doped region adjacent to said gate; the implantation of ions comprises a large angle tilt implant with a twist of between about 40 and 50 degrees and a tilt angle of 40 and 50 degrees.

Another aspect of the embodiment is where said doped region is a N-LDD in an offset LDMOS FET.

Another aspect of the embodiment is where said ions being implanted about along the [110] directions of the silicon substrate.

Another aspect of the embodiment is where the implanting of said ions is performed in one implant step at an about 45 degree twist implant and a tilt angle of about 45 degrees.

Another aspect of the embodiment is where said silicon substrate has a notch/flat at a [110] direction.

Another aspect of the embodiment is where the implanting of ion further comprises: said silicon substrate has a notch/flat at a <110> direction, the implantation comprises an implant with a 45 tilt and 45 twist and the ions enter the substrate aligned at a <0 -1-1> direction whereby the direction increases the channeling.

Another aspect of the embodiment is where said channel has an annular shape with a doped region on the inside of said channel and a second doped region surrounding the outside of said channel.

Another aspect of the embodiment is where said channel has an annular shape with a doped region on the inside of said channel region and a second doped region surrounding the outside of said channel; and the implanting of said ions further comprises a quadra implant at the twist angles of about 45, 135, 225 and 315 degrees with a range of +/-5 degrees; and a tilt angle between 40 and 50 degrees.

Another aspect of the embodiment is where said channel has an annular shape with a doped region on the inside of said channel and a second doped region surrounding the outside of said channel region; and the implanting of said ions further comprises a quadra implant with the ion beams aligned with the <110> direction within plus/minus 2 degrees.

The orientation and implant process creates more channeling of ions. The channeling of ions creates a more graded junction.

When implemented on a HV MOS Tx, the graded junction of the LDD increases the drain breakdown voltage.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

II. Introduction—Current Industry Channel Direction with Respect to the Crystal Direction Referring now to the drawing and more particularly to FIG. 1A, there is shown a structure over which the present invention is an improvement.

Figure 1A:
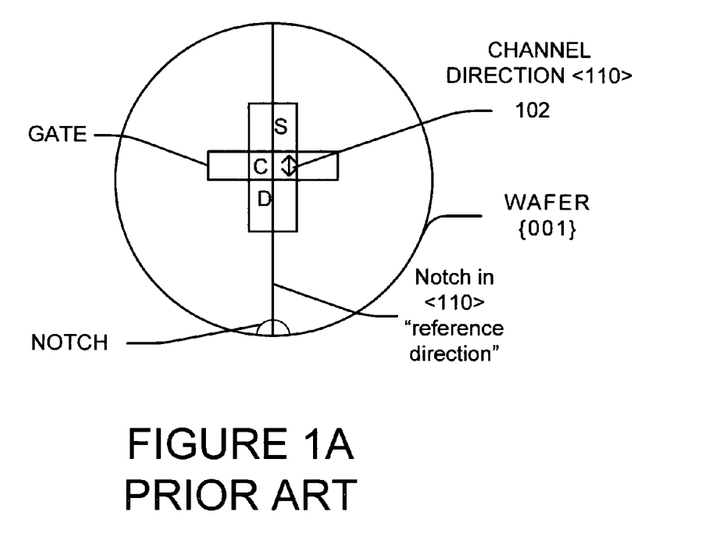
FIG. 1A is a top down view of a wafer having a transistor according to a process known to the inventor.

FIG. 1A is a top down view of a wafer having a transistor. The wafer is {001}. The channel direction 102 is <110>. The channel direction is the direction between source and drain or drain and source. The channel direction is the direction current flows between the source and drain or drain and source. In current 8 inch P-type wafer technology, the notch is along the <110> direction as shown in FIG. 1A.

In manufacturing the FET with the source (S) and drain (D) separated by the gate (G) and having a channel (C) thereunder, the notch permits alignment of the wafer relative to the exposure masks so that the gate width and the channel length thereunder will be parallel or perpendicular with [110] crystal direction.

Problem of Voltage Limitation on Hi Vt NMOS

As the transistor scaling to smaller dimension, our high Vt NMOS transistor is facing a problem with voltage limitation. Thermal cycle was limited because of the consideration of logic device in the wafer.

Currently for high voltage transistor, we need to use high tilt implantation and long time diffusion in order to make the lateral junction of the LDD more graded. For example a lateral diffusion metal oxide semiconductor {LDMOS} was used for high voltage usage. However the LDD regions of the LDMOS need long time (several hours) diffusion to get a graded junction which can sustain high voltage. For sub-micron technology, because of the thermal cycle become more critical. Lower thermal cycle was needed because of the transistor dimension. In this case, LDMOS is not popular for small dimension high voltage transistor. There are mainly two high voltage transistors in the foundry for sub-micron transistors, offset transistor and non-offset transistor. Offset transistor use asymmetrical structure to get higher breakdown voltage. Non-offset structure use higher tilt angle for lateral doped drain (LDD) implantation to increase the breakdown voltage.

Overview of Embodiments of the Invention

In this example embodiment, a special layout for a high voltage transistor is introduced. A set of specific implantation method is given accordingly. A main advantage of this embodiment is to use the silicon crystalogy to get higher channeling effect through special implantation angle and rotation. Accordingly the layout for this implantation was optimized in order to get a more graded junction.

We implant ions into the {0 0 1} silicon substrate to form doped regions adjacent to the gate. The orientation of the channel region in the Si crystal structure (channel direction <100>) in combination with the large angle tilt and twist implant process (describe below) produces doped regions that have a more graded (gradual) junction. The orientation and implant process creates more channeling of ions. The channeling of ions creates a more graded (less abrupt) junction.

Figure 4A:
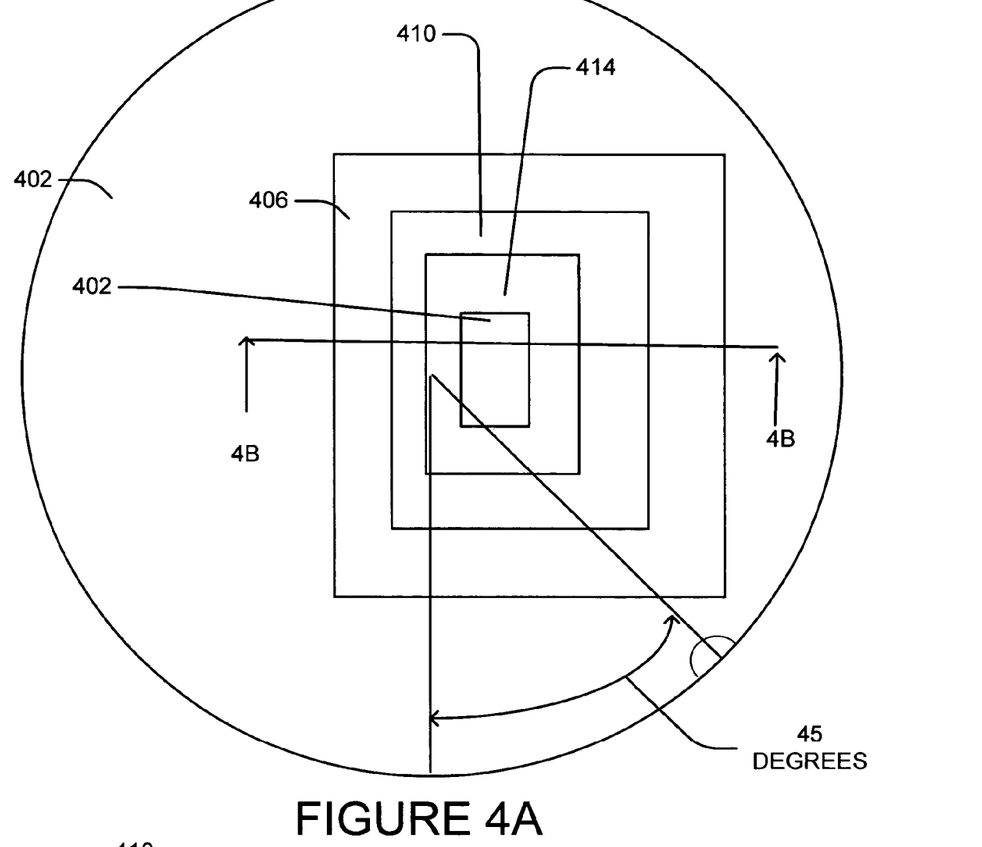
FIG. 4A shows a top down view of a embodiment of a closed shaped transistor according to an embodiment of the invention.

Embodiments of the invention include open and closed shaped transistors and doped regions. An example of a closed shaped Tx is shown in FIG. 4A. Other embodiments include 45 degree twist/45 degree tilt implants. Other embodiment include quadra twist and tilt implants.

With the embodiments of the invention, we can improve breakdown voltage of HV transistor. More graded junction LDD can be obtained without using long diffusion time.

In accordance with the present invention, a standard {001} silicon wafer with a primary notch of <110> direction is used and, before exposure to an image by a lithographic exposure apparatus, the relative relationship between the mask and the {001} silicon wafer is changed so that the relationship, in the same plane, is approximately forty-five degrees (45 degree) from the normal relationship in the same plane. Thus, the [110] crystal direction is aligned approximately 45 degrees to the gate width and will be aligned parallel with channel length direction when voltage is applied to the gate.

This 45 degree change is preferably accomplished by either modifying the mask holder or the wafer holder of an optical lithographic system so the mask holder and the wafer holder are in a relationship of approximately forty-five degrees (45°) from their normal relationship using the <001> crystal direction. The target of the relationship change is exactly 45 degree, because the mobility of the carriers in channel will be optimum when the channel and [110] crystal direction are parallel. However, due to slight imperfection of the lithographic apparatus wafer and mask holders, the change may vary by +−2% of the 45 degree change. The remaining fabrication steps, such as plasma or anisotropic etching, oxidation, chemical vapor deposition, sputtering and planization, are performed without any modification of the wafer holders, because the exposed surface of the silicon wafer to these processes remains in the <001> direction.

Figure 6:
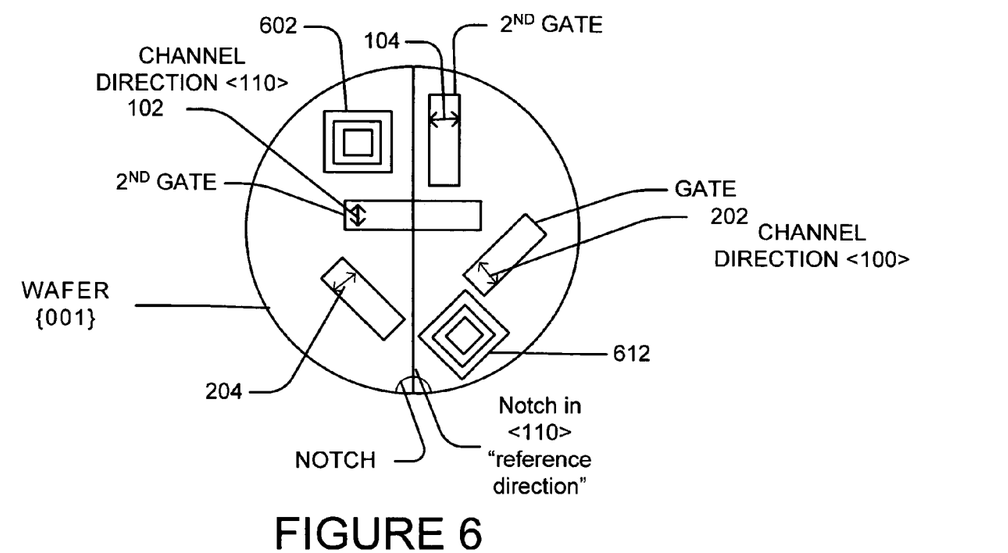
FIG. 6 shows both a standard 0 degree channel 102 104 FET and the embodiments' 45 degree angled channel 202 204 FETs formed on a wafer.

Referring to FIG. 6, on the same wafer, both standard 0 degree and the embodiments' 45 degree angled channel FETs can be formed. For example, FIG. 6 shows both standard 0 degree channel 102 104 FET and the embodiments' 45 degree angled channel 202 204 FETs formed on a wafer (source/drain regions not shown).

Another aspect of the present invention is a novel FET with its gate formed perpendicular to the <100> crystal direction so that the channel will be parallel with this direction with a voltage applied to the gate.

In another aspect of the present invention, annular shaped FETs are formed. FIG. 6 shows annual FETs 602 and 612. FET 612 is has the embodiments channel <100> direction. FET 602 has the <110> channel directions. Any combination of annular and linear FETs with different channel directions can be formed on the same wafer.

The embodiment's <100> channel direction is useful for MOS TX's and can reduce punchthrough.

III. Method of LATID with Channel Orientated in the <100> or <010> Direction

A preferred embodiment of the invention is a method to form a doped region in a semiconductor device. The doped region preferably is a source or drain region in a FET and is more preferably a S or D region in a high voltage transistor such as a LDMOS transistor.

A feature of the process is that a more graded junction is formed by the large angled implant process.

{001} Silicon Substrate Having [110] Reference Direction

Figure 2A:
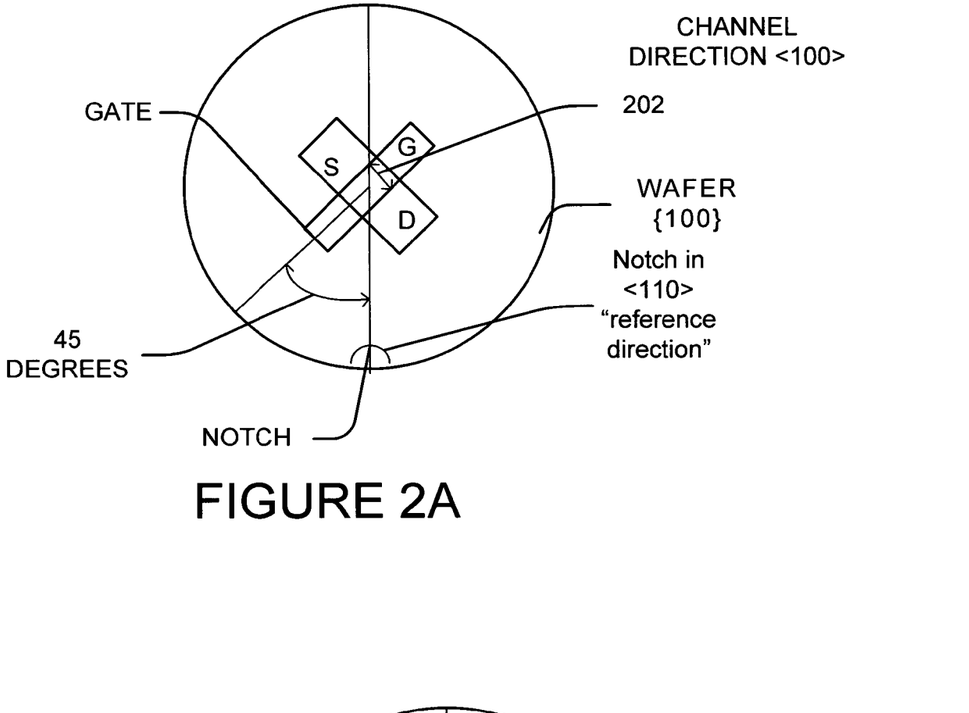
FIG. 2A shows a FET with a channel direction 202 in a <100> direction according to an embodiment of the invention.
Figure 2B:
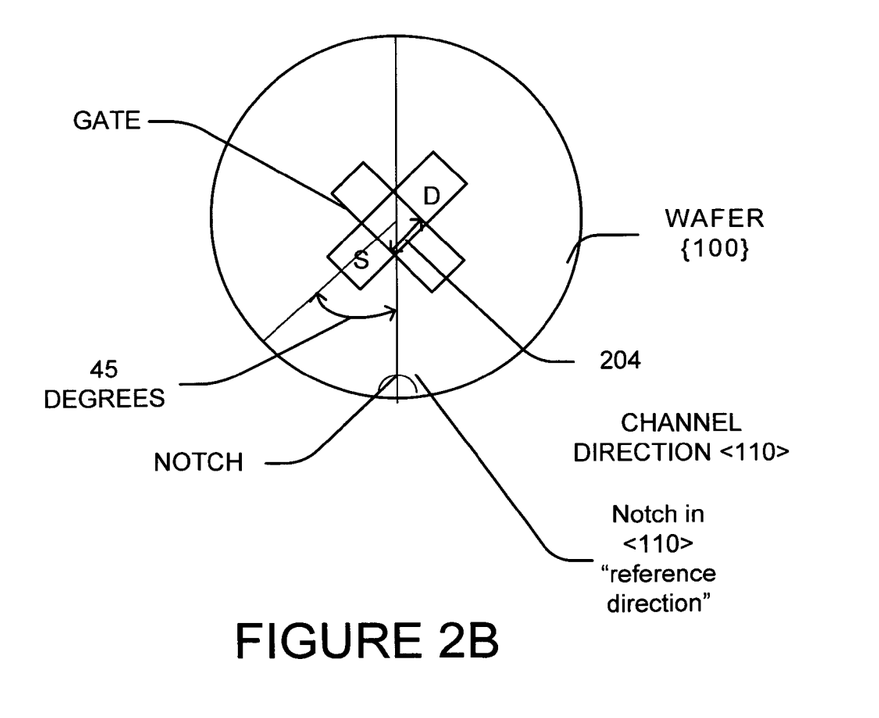
FIG. 2B shows a FET with a channel direction 204 in a <110> direction according to an embodiment of the invention.

Referring to FIG. 2A and 2b, an orientation of the channel (C) of an FET is shown. We provide a {001} silicon substrate having [110] reference direction (direction from substrate center to primary notch/flat).

FIG. 2A shows a FET with a channel direction 202 in a <100> direction.

FIG. 2B shows a FET with a channel direction 204 in a <110> direction.

Devices with both channel directions can be formed on the same wafer.

Gate, Source/Drain and Channel

Next, a gate (G) is formed over the silicon substrate; the gate having a width and a length; a channel under the gate.

The channel (C) has a channel direction (202 204) parallel with the direction of the gate width. The channel direction is the direction of current flow direction. The channel direction is preferably about [100] or [010] crystal direction.

Large Angle Implant with Twist to form Source and Drain

We implant ions into the silicon substrate to form doped regions adjacent to the gate. The orientation of the channel region in the Si crystal structure (channel direction <100>) in combination with the large angle tilt and twist implant process (describe below) produces doped regions that have a more graded (gradual) junction. The orientation and implant process creates more channeling of ions. The ions are preferably implanted along the <110> direction to maximize channeling. The channeling of ions creates a more graded junction. Channeling is when implanted ions are not slowed by collisions with silicon atoms. It is controlled by three different techniques: wafer tilt, screen oxide layer or preamorphization. This embodiment preferably does not use these techniques to reduce channeling.

When implemented on a HV MOS Tx, the graded junction of the LDD increases the drain breakdown voltage.

Figure 1B:
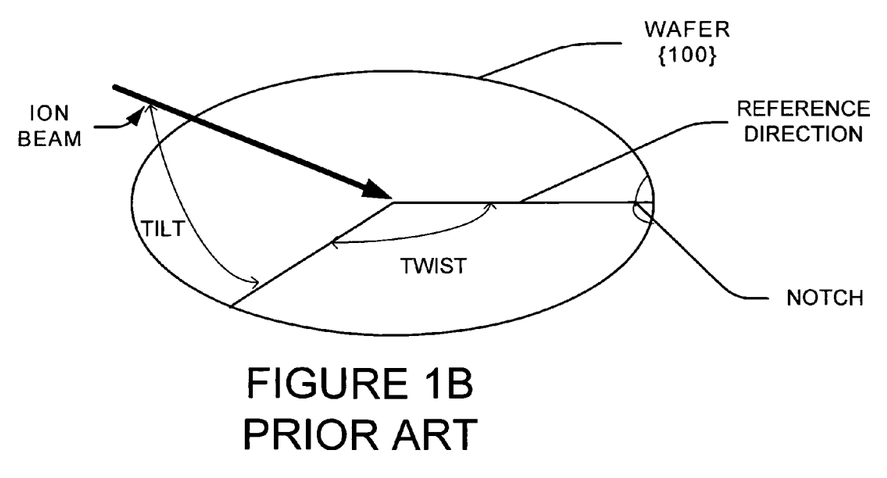
FIG. 1B shows a schematic view of a twist and tilted ion implant according to the prior art for use in understand the terms "twist" and "tilt".

FIG. 1B shows a schematic view of a twist and tilted ion implant according to the prior art for use in understand the terms "twist" and "tilt".

Tilt is the angle between the wafer surface and the ion beam.

Twist is the angle between the vertical plane containing the ion beam and the vertical plane perpendicular to the reference direction (primary notch direction).

Single Implant at 45 Tilt and 45 Twist

Figure 3A:
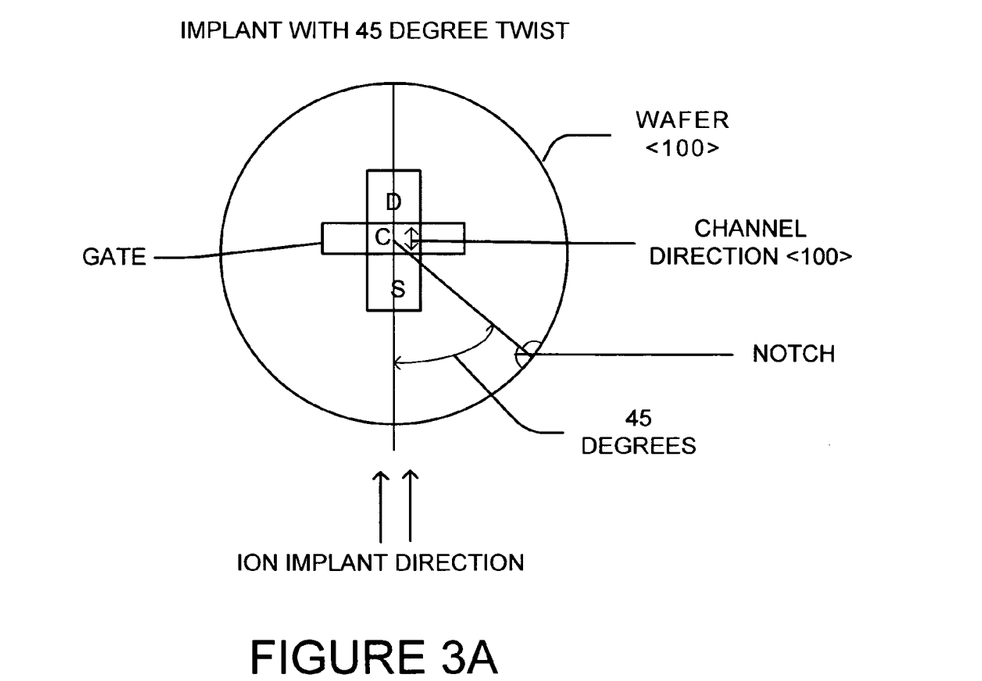
FIG. 3A is a top down view of a wafer showing the channel orientation in a 45 degree twist and 45 degree tilt implant according to an embodiment of the invention.

As shown in FIG. 3A, the implantation of ions preferably comprises a tilt/twist implant with a twist of about 45 degree from the <110> reference direction (notch) of the crystal substrate and a tilt angle between 40 and 50 degrees (from the normal plane of the substrate surface) and more preferably a tilt angle of 45 degrees with a preferred tolerance of +/−5 degrees.

For a (001) wafer (e.g., with a notch of <110>) direction, a implant with a 45 tilt and 45 twist, the ions enter the substrate at a <0 −1 −1> (or <0$\overline{1}\overline{1}$>) direction (or [110] group direction). This direction increases the channeling.

The 45 tilt and 45 twist single implant is preferably performed by implanting Ph ions at an energy between 40 and 400 and a dose between 1E12 and 1E15 at tilt angle between 40 and 50 degrees and more preferably about 45 degrees and a twist angle of between 40 and 50 degrees and more preferably 45 degrees.

This 45 degree twist and 45 degree tilt implant preferably forms a (symmetric) LDD.

FET with a Source (S) and Drain (D) and Gate (G) with a Channel Direction of <100>

Figure 3B:
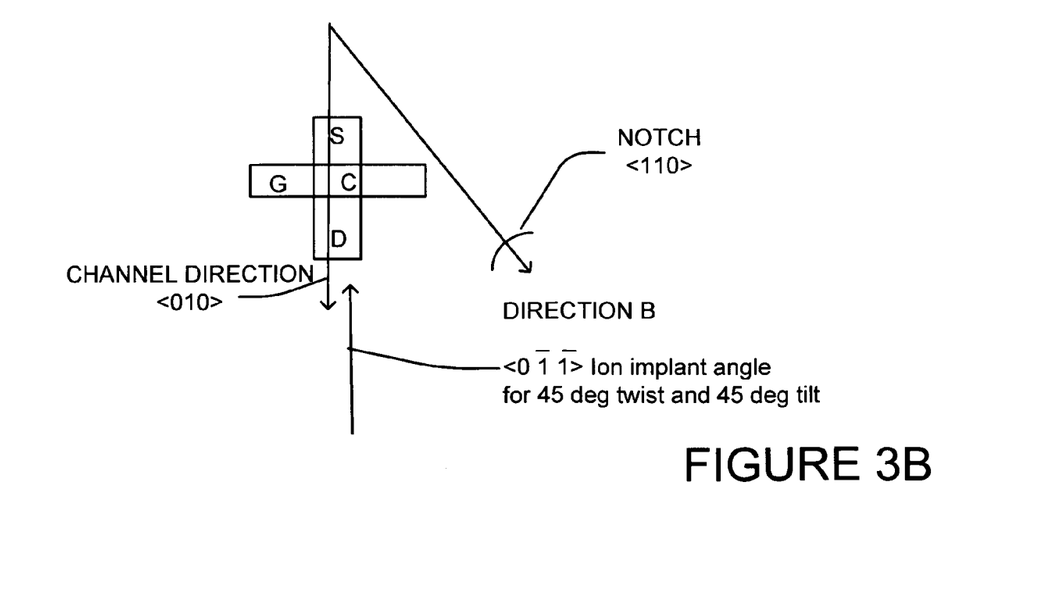
FIG. 3B is a top down view of a wafer showing the channel orientation <010> in a 45 degree twist and 45 degree tilt implant according to an embodiment of the invention.

FIG. 3B shows a top down view of a FET with a Source (S) and Drain (D) and gate (G) with a channel direction of <100> and a reference direction <110> (also for the primary notch).

For a 45 degree twist implant and a 45 degree tilt, the ions are implanted into the S/D region along direction B. Direction B is parallel to the <0$\overline{1}\overline{1}$> (or <0-1-1>).

"Quadra" Implant for Open Shaped Tx

Figure 3C:
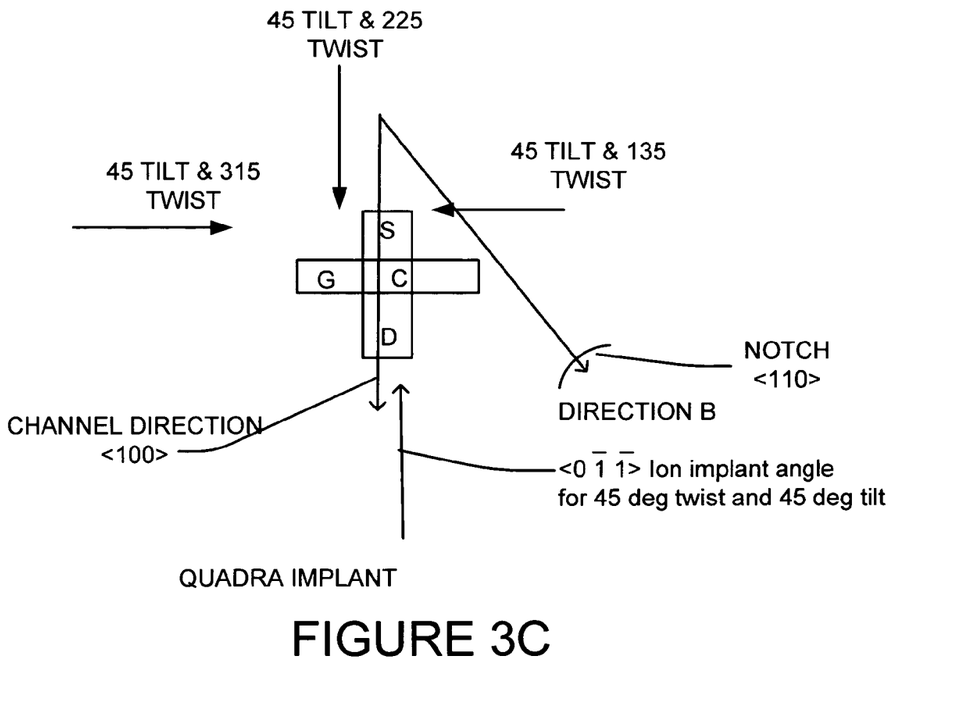
FIG. 3C illustrates a top down view of a quad implant according to an embodiment of the invention.

In a preferred embodiment the implanting of ions into further comprises an quadra implant. The quadra implant is performed by 4 implants of Ph ions at an energy between 40 and 400 Kev and a dose between 1E12 and 1E15 ions/sq-cm at tilt angle between 40 and 50 degrees and a twist angles of between 40 and 50 degrees FIG. 3C illustrates the embodiment's quad implant. The 4 implants at 45, 135, 225, and 315 degrees.

In the quadra implant, the implanted ions are aligned in the [0,−1,−1], [1,0,−1], [0,1,−1], [−1, 0,−1] or <110> directions. (the negative signs represent bars over the 1's, e.g. −1 is equivalent to $\overline{1}$) This maximizes channeling.

Closed Shaped (or Annual Shaped) Channel Region

Figure 4B:
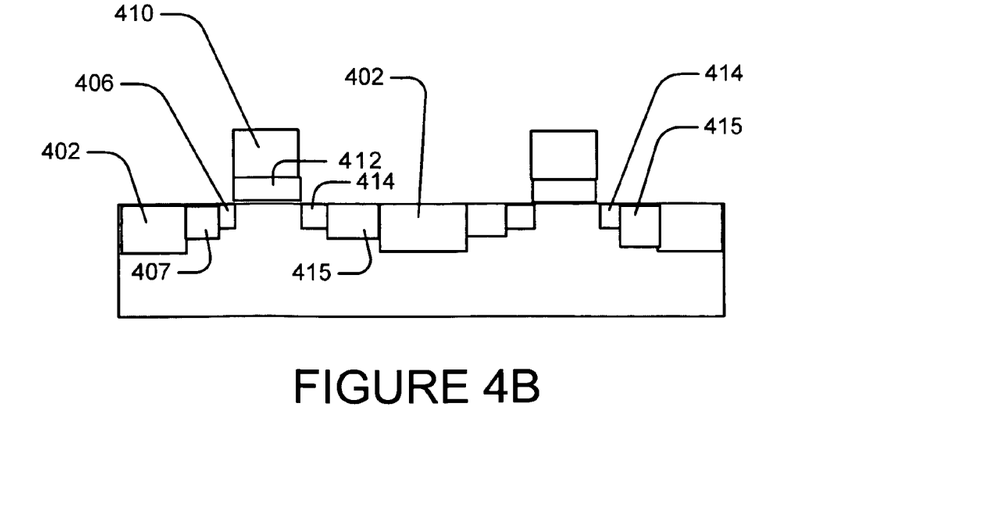
FIG. 4B shows a cross sectional view of the closed FET shown in FIG. 4A along the axis 4B according to an embodiment of the invention.

Referring to FIG. 4A and FIG. 4B, an embodiment is shown where the transistor has a channel region with a "closed shape" so that S/D region on the inside of the channel region and a second doped region surrounding the outside of the channel region.

FIG. 4A shows a top down view of a embodiment of a closed shaped transistor (e.g., with annular shaped channel region). FIG. 4 shows field oxide regions 402, LDD regions 406 414, source /drain regions 407 415 (see FIG. 4B) and gate 410. The LDD regions are preferably formed by the embodiment's implant process. The "closed shape" means that the active region has no beginning or end. The channel under the gate 410 is surrounded by the LDD 406. The channel is preferably annular shaped and is more preferably rectangular or square shaped.

FIG. 4B shows a cross sectional view of the closed FET shown in FIG. 4A along the axis 4B according to an embodiment of the invention. FIG. 4B show a gate dielectric layer 412 under the gate 410.

The embodiments of the annular channel Tx can be a normal voltage Tx or a offset LDMOS or a Non-offset LDMOS.

Quadra Implant Method for Closed (e.g., Annular) Channel Region

For the closed shaped doped region, for example as shown in FIG. 4A, preferably a quadra implant is performed.

HV LDMOS TX with Offset Transistor and Non-Offset Transistors

The channel orientations and implant embodiments of the invention on can be used to form HV LDMOS TX with offset transistor and non-offset transistors.

Figure 7:
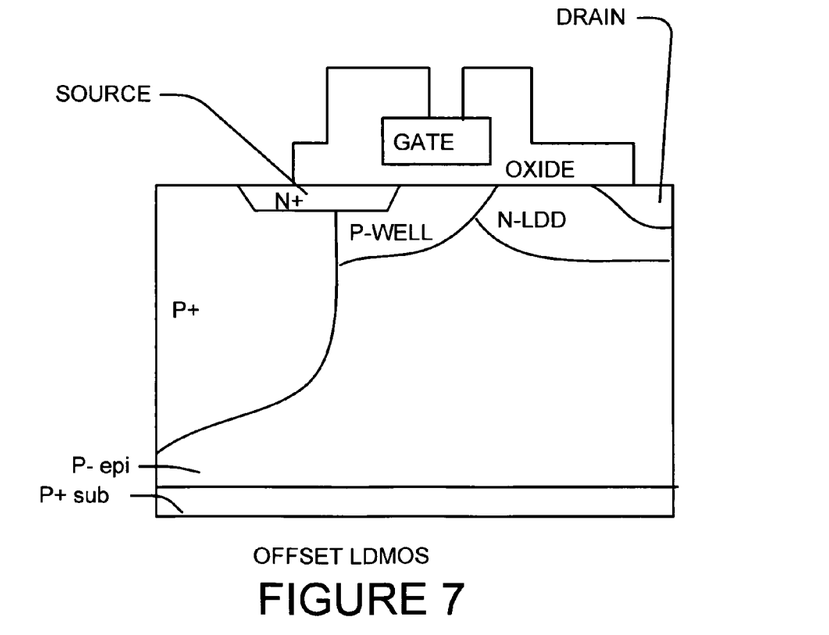
FIG. 7 shows an example of an offset LDMOS TX according to an embodiment of the invention. The channel for the LDNMOS TX is preferably a p-well.

FIG. 7 shows an example of an offset LDMOS TX. The channel is a diffused p-well for the LDNMOS TX.

In the offset LDMOS TX (FIG. 7), only the N-LDD is formed using the embodiment's ion implant at [110] to maximize the ion channeling.

In the non-offset LDMOS TX (FIG. 8), preferably the N+ source and the N+ drain are simultaneously formed in the same implant step using the embodiment's ion implant at [110] to maximize the ion channeling.

Process for Offset LDMOS TX (FIG. 7)

The process to form the OFFset LDMOS TX is as follows:

form p-epi on substrate form p-well form (poly) gate form N-LDD (using embodiments' channeling maximizing ion implant)

form spacers on gate form source (S) and drain (D) using a standard I/I.

Currently, the offset LDMOS Tx operates at a voltage between about 18V and 60 V. In comparison a normal voltage Tx operates between about 1V to 18V.

Non-Offset LDMOS TX

Figure 8:
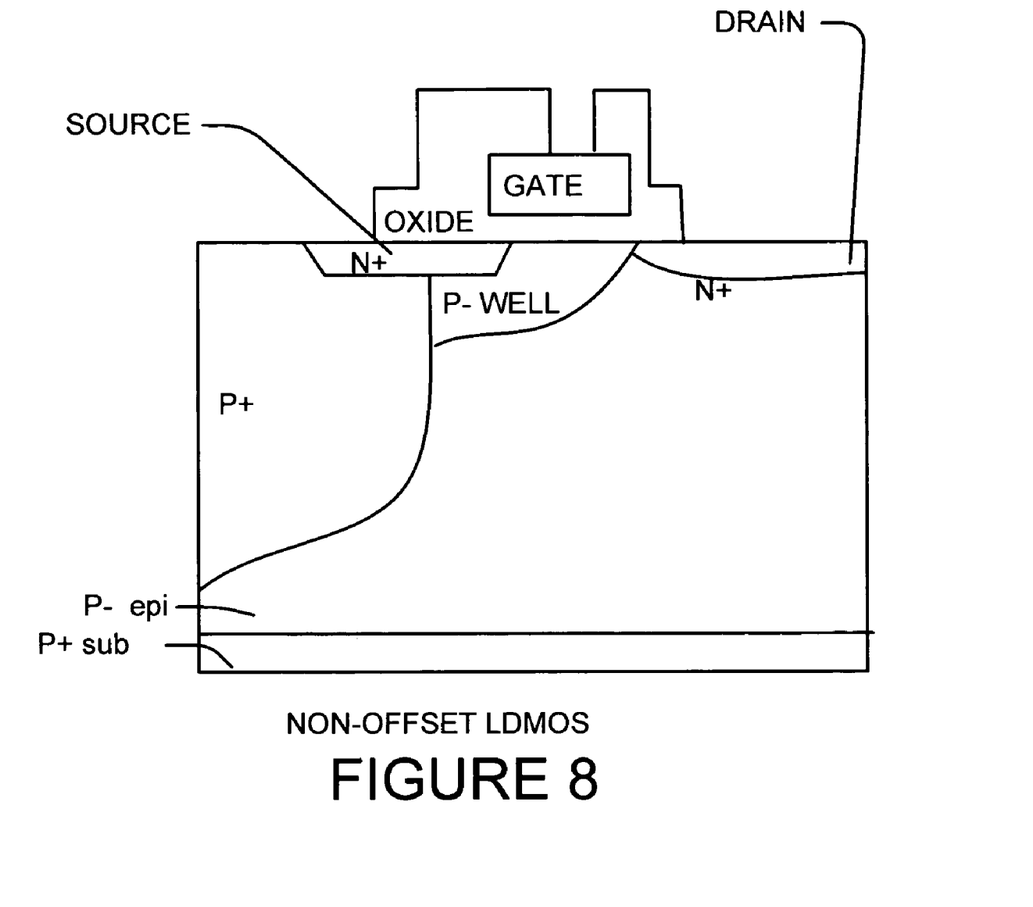
FIG. 8 shows an example of a non-offset LDMOS TX formed using the embodiment's channel maximizing implant process for the source and drain.

FIG. 8 shows an example of a non-offset LDMOS TX. Usually we use a lot of diffusion to get a smooth and graded junction between the N+ and p- well. With the embodiment's wafer alignment and drain implant process, a good graded junction can be obtained. The breakdown voltage decreases with the embodiment because of the graded junction.

Process for Non-Offset LDMOS TX

The process to form the FIG. 8, non-offset LDMOS TX is as follows:

form p-epi on substrate form p-well form poly gate form N-LDD (using embodiments' channeling max ion implant)

form spacers form N+ source and drain using invention's maximizing channeling ion implant.

Currently, the non-offset LDMOS Tx operates at a voltage between about 12V and 25 V. In comparison a normal voltage Tx operates between about 1V to 18V.

IV. EXAMPLES

The following non-limiting examples represent preferred forms and best modes contemplated by the inventor for practice of his invention, as well as illustrating the results obtained through its use.

High Voltage LDMOS transistor were fabricated using the standard transistor orientation shown in FIG. 1 and an embodiments orientation shown in FIG. 2A (e.g., channel in <100> direction). Ph ions were implanted at the conditions shown in the table below to form the N-LDD.

TABLE comparison of embodiment and standard LDD implants

| parameter | 45° tilt and 45° twist implant | 30° tilt and 0° twist implant |
| --- | --- | --- |
| dose | 1E12 atoms/sq-cm | 1E12 atoms/sq-cm |
| energy | 80 Kev | 80 Kev |
| Junction depth | 0.75 μm | 0.5 μm |
| Breakdown voltage | 16.2 V | 14.0 V |

As shown in the table above, the embodiment's 45° tilt and 45° twist LDD implant had a deeper junction depth and a higher breakdown voltage.

The LDD implant on the embodiment's transistor orientation has increased channeling of ion that creates a deeper and more graded junction. The reduces the breakdown voltage. This is important especially on the HV transistor.

Figure 5:
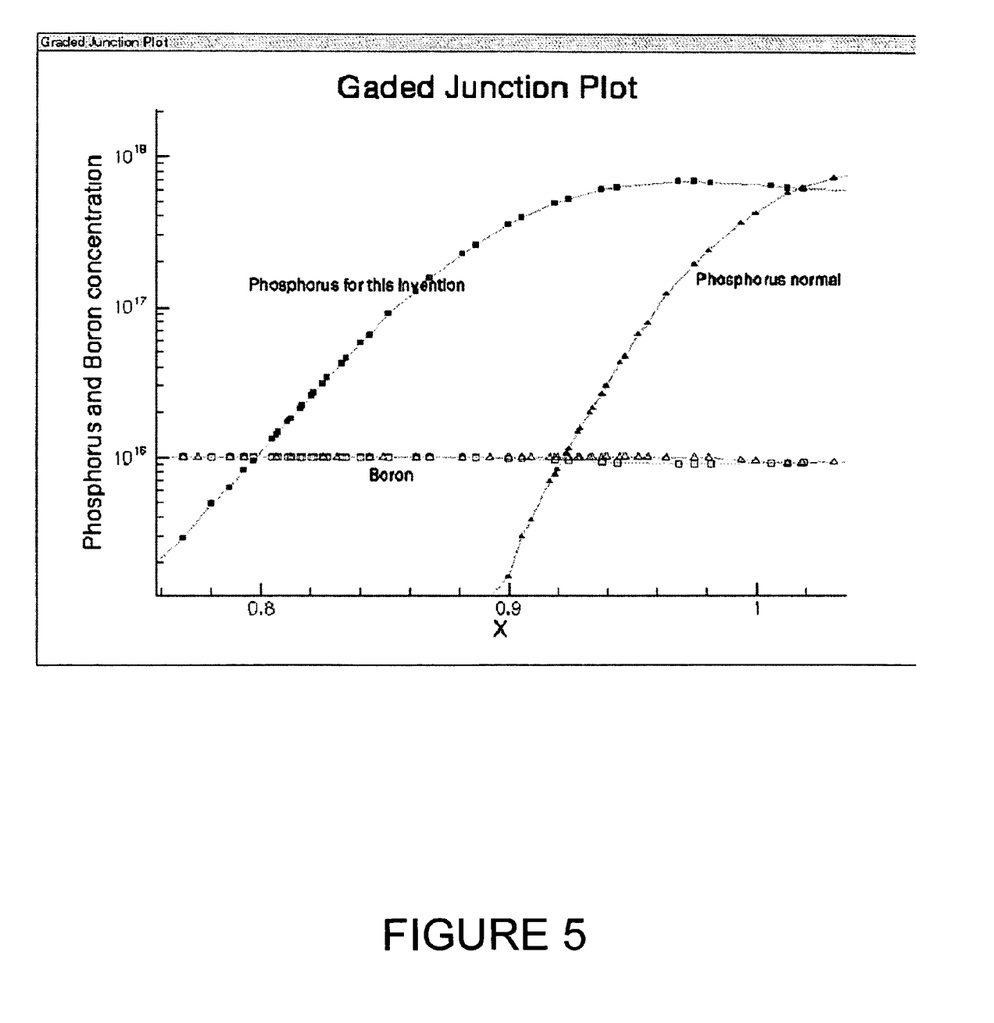
FIG. 5 shows a plot of the phosphorus concentration of the graded junction N-LDD of the embodiment in a normal V MOS TX compared to a conventional Ph profile.

FIG. 5 shows a plot of the phosphorus concentration of the graded junction N-LDD of the embodiment in a normal V MOS TX compared to a conventional Ph profile. The boron concentration of about 1E18 is the concentration of the p-well. (See e.g., FIGS. 7 and 8.)

V. Ending

In summary, a new set of layout and implantation methods was given in the embodiments of this invention. A purpose is to use crystal structure of silicon to improve the junction or the LDD or S/D to obtain high breakdown voltage. It can be used for DMOS and HVNMOS and other high voltage transistor and normal MOS Transistors.

The embodiments' implant process can be performed on any wafer so that the ions enter the wafer in the [110] direction. The embodiments are not dependents on any configuration of wafer notches and/or flats. The orientation of notches and flat change with wafer technology.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A semiconductor device comprised of at least one field effect transistor (FET) having a source, drain and gate with the source and drain separated by a channel under the gate, comprising:
   a {001} silicon substrate;
   a gate having a gate length and a gate width; said gate having the gate width in the [100] or [010] crystal directions;
   a source on one side of said gate and a drain on the other side of the gate, with impurities of the source and drain being disposed in the {001} silicon substrate; and
   a channel under the gate between the source and drain when voltage is applied and being aligned in a direction parallel with the direction of the gate width, whereby the performance of the FET is enhanced.

2. The semiconductor device of claim 1 which further comprises said channel has an annular shape.

3. The semiconductor device of claim 1 which further comprises a second gate over said silicon substrate; said second gate having a width and a length; a second channel under the second gate; said second channel having a second channel direction parallel with the direction of width of said second gate; said second channel direction is parallel or perpendicular with the <110> direction.

4. The semiconductor device of claim 1 wherein the field effect transistor is a LDMOS device comprised of said source, said drain, said gate and said channel.

5. An integrated circuit with at least one field effect transistor (FET) having a source, drain and gate with the source and drain separated by a channel under the gate, comprising:
   a {001} monocrystalline silicon substrate having (100) and (110) crystal planes and [100] and [110] crystal directions;
   a gate having a length and a width and being insulated from the substrate by a gate dielectric layer, said gate having a gate width in the [100] or [010] crystal direction;
   a source on one side of the gate width and a drain on the other side of the gate width, and
   a channel being formed under the gate between the source and drain when voltage is applied and being aligned in a direction parallel with the direction of the gate width.

6. The integrated circuit of claim 5 wherein said channel has a closed shape with either said source or said drain surrounding the outside of said channel region.

7. The integrated circuit of claim 5 which further comprises a second FET over said {001} monocrystalline silicon substrate, said second FET comprised of a second gate over said {001} monocrystalline silicon substrate; said second gate having a second gate width and a second gate length; a second channel under the second gate; said second channel having a second channel direction parallel with the direction of width of said second gate; said second channel direction is parallel or perpendicular with the <110> direction.

8. The integrated circuit of claim 5 wherein said {001} monocrystalline silicon substrate has a notch/flat at a [110] direction.

9. The integrated circuit of claim 5 wherein the field effect transistor is a LDMOS device comprised of said source, drain, said gate and said channel.

10. The integrated circuit of claim 5 which further comprises a second FET over said {001} monocrystalline silicon substrate, said second FET comprised of a second gate over said {001} monocrystalline silicon substrate; said second gate having a second gate width and a second gate length; a second channel under the second gate; said second channel having a second channel direction parallel with the direction of width of said second gate; said second channel direction is parallel or perpendicular with the <110> direction; and a third FET with an annular channel.

11. The integrated circuit of claim 5 wherein said gate has a gate width in the [100] crystal direction so that the gate width is aligned approximately orthogonal to the (100) crystal plane and parallel with the [100] crystal direction.

12. The integrated circuit of claim 5 wherein the {001} monocrystalline silicon substrate is comprised of a wafer having a <110> reference direction from a substrate center to a primary notch/flat.

13. The semiconductor device of claim 1 wherein said {001} silicon substrate is comprised of a wafer having a <110> reference direction from a substrate center to a primary notch/flat.

14. The semiconductor device of claim 1 which further includes a second FET having a second channel with a closed shape with either a second source or a second drain surrounding the outside of said second channel.

15. The semiconductor device of claim 1 which further includes a second FET having a rectangular shaped channel with a closed shape with either a second source or a second drain surrounding the outside of said second channel.

16. The semiconductor device of claim 1 which further includes a second FET having a second channel having a closed shape; said second channel has a second channel direction in the <100> or <110> directions.

17. The semiconductor device of claim 1 which further includes a second FET having a second channel with a rectangular shape; the second channel has a second channel direction in the <110> directions.

18. A semiconductor device comprised of at least one field effect transistor (FET) having a source, drain and gate with the source and drain separated by a channel under the gate, comprising:
a {001} silicon substrate;
a gate comprised of a first gate portion; said first gate portion having a first gate portion length and a first gate portion width; said first gate portion width in the [100] or [010] crystal directions;
a source on one side of said gate and a drain on the other side of the gate, with impurities of the source and drain being disposed in the {001} silicon substrate; and
a first channel region under the first gate portion between the source and drain; the first channel region and aligned in a direction parallel with [100] or [010] crystal directions, whereby the performance of the FET is enhanced.

19. The semiconductor device of claim 18 wherein the gate is comprised of a second gate portion;
a second channel region under the second gate portion between the source and drain; the second channel region aligned in a direction perpendicular with said first gate portion.

20. The semiconductor device of claim 18 wherein the gate has a closed shape.

21. The semiconductor device of claim 1 wherein said channel has an annular shape; and said source or said drain has an annular shape.

22. The semiconductor device of claim 1 wherein said channel has an annular shape; and said source and said drain both have an annular shape.

23. The semiconductor device of claim 1 wherein said channel has an annular shape; and said source or said drain has an annular rectangular shape.

* * * * *

UNITED STATES PATENT AND TRADEMARK OFFICE
CERTIFICATE OF CORRECTION

| | | |
|---|---|---|
| PATENT NO. | : 7,253,483 B2 | Page 1 of 2 |
| APPLICATION NO. | : 11/167640 | |
| DATED | : August 7, 2007 | |
| INVENTOR(S) | : Yisuo Li et al. | |

It is certified that error appears in the above-identified patent and that said Letters Patent is hereby corrected as shown below:

In the drawings, Sheet 5 of 8, Figure 4B, on the right side, the reference number "415" should read --407-- and the reference number "414" should read --406-- as follows below. Attached drawing as shown.

FIGURE 4B

In col. 8, Line 3, "FIG. 4 shows" should read --FIGS. 4A and 4B show--.

In col. 8, Line 5, "LLD" should should read --LDD--.

Signed and Sealed this

Eighth Day of September, 2009

David J. Kappos
Director of the United States Patent and Trademark Office

FIGURE 4A

FIGURE 4B